(12) United States Patent
Jordan et al.

(10) Patent No.: US 6,598,112 B1
(45) Date of Patent: Jul. 22, 2003

(54) METHOD AND APPARATUS FOR EXECUTING A PROGRAM USING PRIMARY, SECONDARY AND TERTIARY MEMORIES

(75) Inventors: Stephen D Jordan, Ft Collins, CO (US); Alan S Krech, Jr., Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 402 days.

(21) Appl. No.: 09/659,259

(22) Filed: Sep. 11, 2000

(51) Int. Cl.[7] ............................. G06F 12/00; G06F 9/45; G11C 29/00
(52) U.S. Cl. ........................... 711/2; 711/5; 714/718; 717/140
(58) Field of Search .................. 711/2, 5, 118, 711/122, 165; 714/718, 738; 717/140

(56) References Cited

U.S. PATENT DOCUMENTS

| | | | | |
|---|---|---|---|---|
| 4,502,127 A | * | 2/1985 | Garcia et al. ............... | 711/100 |
| 5,265,102 A | * | 11/1993 | Saito .......................... | 714/743 |
| 5,838,694 A | * | 11/1998 | Illes et al. .................. | 714/738 |
| 5,883,905 A | * | 3/1999 | Eastburn ..................... | 714/738 |
| 5,923,675 A | * | 7/1999 | Brown et al. ............... | 714/738 |
| 6,006,350 A | * | 12/1999 | Tsujii ......................... | 714/738 |
| 6,009,546 A | * | 12/1999 | Kuglin et al. ............... | 714/738 |
| 6,092,225 A | * | 7/2000 | Gruodis et al. ............. | 714/724 |
| 6,161,206 A | * | 12/2000 | Wasson ...................... | 714/738 |
| 6,289,478 B1 | * | 9/2001 | Kitagaki ..................... | 714/724 |

* cited by examiner

Primary Examiner—Glenn Gossage (57) ABSTRACT

A method and apparatus for executing an integrated circuit (IC) test program including at least one calling instruction partitions at least one called subroutine into first and second subroutine portions, loads IC test program instructions into a primary memory, loads the first subroutine portion into the primary memory contiguous with the calling instruction, inserts a memory transfer access instruction after the first portion, and loads a remainder of the IC test program instructions into primary memory. The method then executes instructions from primary memory. Execution of the calling instruction in the primary memory causes the second subroutine portion to be loaded into a FIFO element from a secondary memory. The first subroutine portion executes from the primary memory. Execution of the memory transfer access instruction initiates fetching and executing the second portion of the called subroutine from a first-in-first-out (FIFO) element.

15 Claims, 6 Drawing Sheets

Primary Memory 20

```
602  x=0, y=0, z=0              # Initialize
     vcall Test1, x++           # Initiate fetch and load from secondary
                                     memory into tertiary memory
     |------------------
  406|
     | first portion of         # Execute copy of first portion of Test1
     |     Test1
  604|________________
     vcallgo                    # Transfer fetch and execute of
                                     instructions to the tertiary memory
  610
     vcallgo                    # Fetch and execute Test2 from the
                                     tertiary memory
     quit                       # Control returns to the Test Site
                                     Controller
```

Secondary Memory 21

```
logic_subroutine Test1  — 606
    |------------------
406 | first portion of Test1
    |________________
    |------------------
408 |
    | second portion of Test1
    |
    |_return_______________ logic_subroutine Test2  — 608
    |------------------
    |
    | } 612
    |
    |
    |
    |_return_______________
```

FIG. 6

METHOD AND APPARATUS FOR EXECUTING A PROGRAM USING PRIMARY, SECONDARY AND TERTIARY MEMORIES

BACKGROUND

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. Personal Computer Memory Card International Association ("PCMCIA") cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and use logical methods to isolate portions of the pattern that do not perform as expected. A test pattern that is generated algorithmically using instructions and commands that are repeated in programming loops consume less space in tester memory. Accordingly, it is desirable to have algorithmic test pattern generation capability in a memory tester.

Precise signal edge placement and detection is also a consideration in the effectiveness of a non-volatile tester. In order to capture parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test ("DUT"), here a memory.

Memory testers are said to generate transmit vectors that are applied (stimulus) to the DUT, and receive vectors that are expected in return (response). The algorithmic logic that generates these vectors can generally do so without troubling itself about how a particular bit in a vector is to get to or from a particular signal pad in the DUT. At this level it is almost as if it were a certainty that adjacent bits in the vector would end up as physically adjacent signals on the DUT. Life should be so kind!

In reality, the correspondence between bits in a vector at the "conceptual level" and the actual signals in the DUT is apt to be rather arbitrary. If nothing were done to prevent it, it might be necessary to cross one or more probe wires as they descend from a periphery to make contact with the DUT. Such crossing is most undesirable, and it is convention to incorporate a mapping mechanism in the path of the transmit vector to rearrange the bit positions in the transmit vector before they are applied to the DUT, so that task of making physical contact is not burdened with crossings. Receive vectors are correspondingly applied to a reverse mapping mechanism before being considered. In this way the algorithmic vector generation and comparison mechanisms can be allowed to ignore this entire issue. As another example of what such mappers and reverse mappers can do, consider the case when a different instance of the same type of DUT is laid out on the same wafer, but with a rotation or some mirrored symmetry, in order to avoid wasting space on the wafer. These practices also have an effect on the correspondence between vector bit position and physical signal location, but which can be concealed by the appropriate mappings and reverse mappings. It will be appreciated that the mappings and reverse mappings needed for these situations are, once identified for a particular DUT, static, and need not change during the course of testing for that particular DUT.

Historically, application specific integrated circuits (ASICs) are used in memory testers in order to take advantage of the efficiency associated with an ASIC designed to perform a few complex tasks many times. In order to properly test larger memories the tester must be equipped with a significant amount of memory to properly store all of the test vectors that comprise a single test program. The tester must also be faster than the memory it is testing in order to properly characterize and test the timing characteristics of the integrated circuit ("IC"). Historically, memory testers use static random access memory ("SRAM") for program storage. The SRAM is embedded into the tester ASIC to achieve the greatest tester efficiency. SRAM is useful because it exhibits a minimum latency permitting accurate reproduction of timing conditions for testing purposes. SRAM, however, is costly. As test programs increase in size, a natural solution is to merely increase the amount of embedded SRAM in order to accommodate the entire test program. SRAM, however, is expensive. It is difficult to cost-effectively embed a sufficient amount of SRAY, into the tester ASIC to accommodate storage of all test patterns used in some useful test programs. An alternative to a large embedded SRAM is a large and cost effective memory that is located external of the sequencer, specifically a dynamic random access memory ("DRAM"). Disadvantageously, there is a significant read latency associated with DRAM. This read latency would render any testing of timing characteristics indeterminable and therefore unusable.

There is a need, therefore, for a method and apparatus of using the benefit of the minimum latency SRAM as well as the benefit of the cost effective DRAM to achieve the desired result of an IC tester capable of executing a lengthy test program without being limited by the latency inherent in DRAM.

SUMMARY

A method for executing an IC test program, the IC test program comprising main program instructions, at least one called subroutine, and at least one subroutine calling instruction, the method comprising the steps of partitioning the subroutine into first and second subroutine portions, loading the main program instructions into a primary memory, the main program instructions including at least one of said calling instructions, loading the first portion at a location in the primary memory contiguous with the calling instruction, inserting a memory transfer access instruction after the first portion, and loading a remainder of the main program instructions into the primary memory. The method continues with the steps of fetching and executing instructions from the primary memory, executing the calling instruction from the primary memory, the calling instruction causing the second portion of the called subroutine to be loaded into a tertiary memory from a secondary memory, executing the first portion from the-primary memory, and executing the memory transfer access instruction to initiate the steps of fetching and executing the second portion of the called subroutine from the tertiary memory. The method further comprises the steps of executing a return instruction in the second portion of the called subroutine, and the resumes fetching and executing the main program instructions from the primary memory.

An apparatus for executing an IC test program routine comprises a primary memory having main program instructions and at least one first portion of a called subroutine stored therein, a secondary memory having program instructions of subroutines called in the main program instructions stored therein, and a tertiary memory comprising a FIFO element connected to the secondary memory. The apparatus also comprises a memory controller capable of directing access and storage of the subroutine instructions located in the secondary memory from the secondary memory to the tertiary memory upon execution of a secondary memory access instruction in the program instructions located in the primary memory, and a sequencer connected to the primary and tertiary memories, wherein the sequencer accesses and executes the program instructions stored in the primary and tertiary memories as directed by the program instructions.

A method for compiling an IC test program source code into object code wherein the source code is a test pattern having a calling instruction and having a called subroutine comprises the steps of partitioning the called subroutine into a first portion and a second portion and converting the first portion into first portion object code and converting the second portion into second portion object code. The method continues with the steps of evaluating the test pattern including the calling instruction, converting each line of source code of the test pattern into corresponding object code, inserting a copy of the first portion object code into the object code test pattern contiguous with the calling instruction, inserting a secondary memory access instruction into the test pattern after and contiguous with the first portion object code in said test pattern, and converting each remaining line of source code of the test pattern into corresponding object code. The method for compiling then stores the resulting test pattern object code into a test pattern file for downloading into a primary memory, and stores the second portion object code into a subroutine file for downloading into secondary memory.

Advantageously, a method and apparatus used in a memory tester according to the teachings of the present invention permits efficient and cost effective use of DRAM in conjunction with SRAM to achieve lengthy test patterns without affecting the timing of the test program execution.

DETAILED DESCRIPTION

Figure 1:
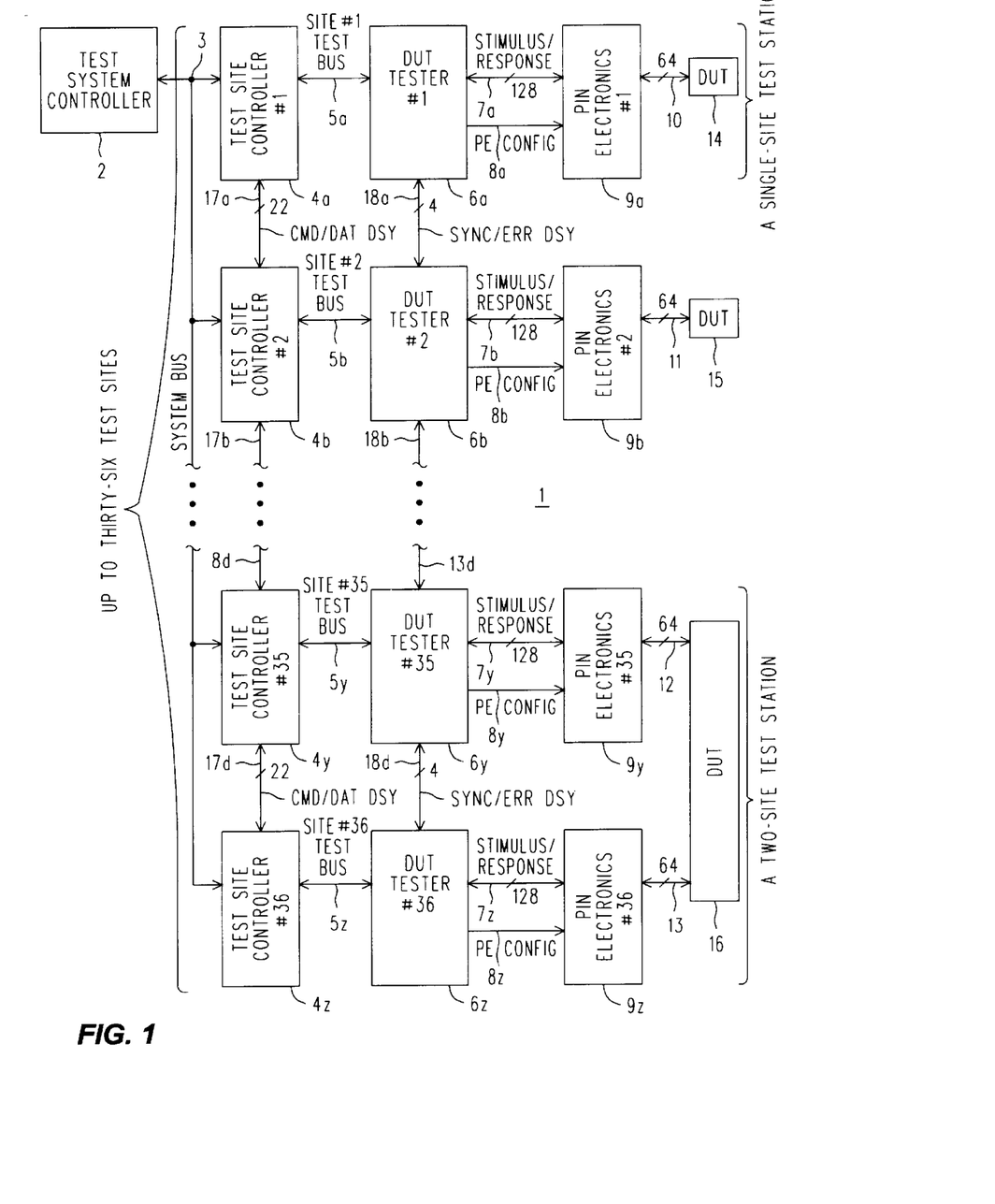
FIG. 1 is a block diagram of a memory tester according to the teachings of the present invention.

Refer now to FIG. 1, wherein is shown a simplified block diagram of a Non-Volatile Memory Test System 1 constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

To briefly consider the opposite case, one should not assume that an entire Test Site is needed to test a single DUT, or that a single Test Site can test but a single DUT. Suppose that a wafer had two (probably, but not necessarily, adjacent) dies, the sum of whose test channel requirements were sixty-four channels or less. Both DUT's can be tested by a single Test Site. What mFakes this possible is the general purpose programmability of each Test Site. A test program executed by the Test Site may be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. The only difference is individually keeping track of whether the two "component DUT's" pass or fail, as opposed to a unified answer for the "third" DUT (that is, there is an issue concerning what portion of the "third" DUT failed). This "Single-Site Multi-Test Station" capability is largely conventional, and we mention it here for the sake of completeness, and to ward off potential confusion and misunderstanding when comparing it to the notion of bonding two or more Test Sites together.

Were it not for this notion of reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were split to create more Test Stations (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers 4a through 4z. (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a Personal Computer running a Microsoft Windows NT operating system) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four Megabytes of combined program and data memory running a proprietary operating system called VOS (VersaTest O/S), which was also used in earlier products for testing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded computer system) to run the associated test program, say, TEST_WHIZ_13. If that program is already available within Test Site Controller #1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named (just as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes on the die, and this mapping is understood by the DUT Tester 6. The individual bits are correct as to their timing and edge placement, but in addition to the mapping they may also need voltage level shifting before they can be applied to the DUT. Likewise, a response that originates in the DUT 14 subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage-has, besides power supplies and water cooling (fans can be a source of contamination in a clean room environment), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master/slave relationships between various Test Site Controllers. We shall denote these daisy chained style communication arrangements with the suffix noun "DSY", instead of "BUS". Thus, we might refer to a Command /Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts—the reader is invited to imagine that there are another ten subscript symbols in there, someplace.) A CMD/DAT DSY 17a (Command & Data Daisy Chain) interconnects the Test Site controllers 4a–4f that are in one card cage, while a different CMD/DAT DSY 17b interconnects the Test Site Controllers 4g–4m in another card cage. The same arrangement exists for the remaining card cages, and Test Site Controllers 4n–4t and 4u–4z, respectively. We have earlier said that the DSY do not leave the card cages, in that the "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17a–d that we have been discussing exist between the various Test Site Controllers 4a–4z. There is a similar arrangement for the SYNC/ERR DSY 18a–18d and the DUT Testers 6a–6z. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

Figure 2:
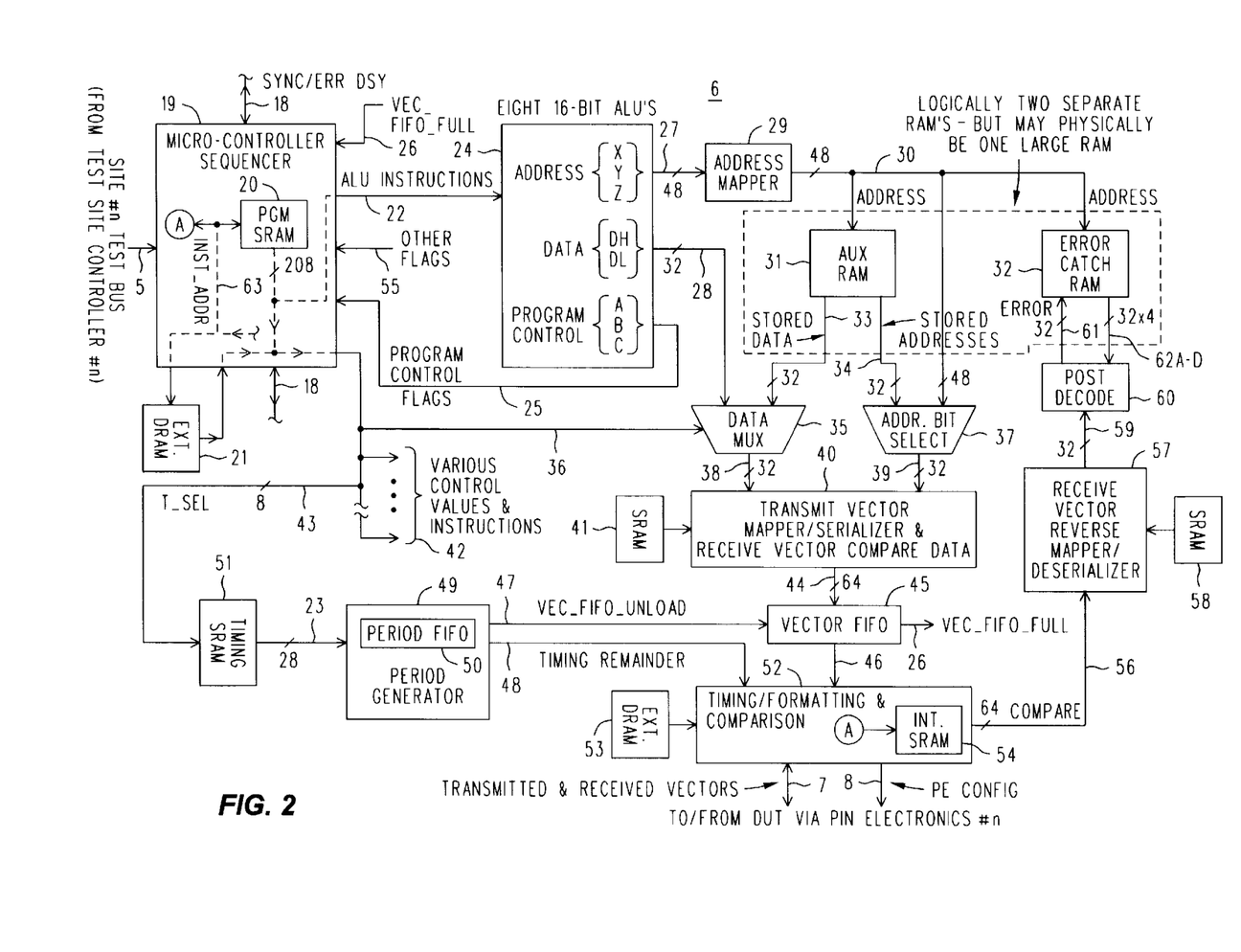
FIG. 2 is a block diagram of a DUT tester portion of the memory tester according to the teachings of the present invention.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff; especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point Is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Site Test Bus 5, which originates from a Test Site Controller 4 (FIG. 1) that is associated with the instance of the DUT Tester 6 that is of interest. With reference to FIG. 2 of the drawings, the Site Test Bus 5 is coupled to a Micro-Controller Sequencer 19, which may be likened to a special purpose microprocessor. It fetches instructions from a program stored in a program memory, which may be either internal to the Micro-Controller Sequencer 19 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is a large IC), so its size is limited. The external DRAM can be provided in adjustable amounts of considerable quantity, but is fast only when accessed in sequential chunks involving linear execution and no branching. Programming in the SRAM 20 is most often algorithmic, while the EXT. DRAM 21 is best suited for material not readily generated by algorithmic processes, such as initialization routines and random or irregular data.

The instruction word executed by the Micro-controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of arithmetic logic unit ("ALU") INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to be supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address in ways familiar to those who understand microprocessors. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT 14 is information concerning the rate of eventual vector application, or, each vector's duration. Thus, the rate of vector application to the DUT 14 need not be constant, and in particular, a group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be the size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, blocks or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for bottom) mirror image of another section of circuitry. This has the effect of rearranging what the bits mean, as far as what sequential address values are in physical order within that circuitry. This chip layout property may occur many times, and it may well be the case that how one group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how it is actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to an Aux RAM 31 and to an Error Catch RAM 32, which, while having separate functions, may nevertheless be implemented as selectable partitions in one larger overall RAM. The mapped address output 30 is also applied as one input to an Addr. Bit Select circuit 37, which is described below.

Consider the Aux RAM 31. Its function is to retain data patterns 33 and addresses 34 that can be applied to the DUT. These are logically separate outputs from the Aux RAM 31, since they are treated somewhat differently and used in different places. (The AUX RAM 31 is not a dual "port memory", but is preferably several banks whose outputs are applied to MUX's.) In keeping with this, it may be that Stored Data 33 is kept in one bank or range of addresses of the Aux RAM 31, while Stored Addresses 34 are kept in another. Also, we have not shown an explicit mechanism for writing to the Aux RAM 31. That is accomplished by an addressed bus operation initiated by a Test Site Controller 4 at the behest of the program it is executing. There is "utility services" bus called the "Ring Bus", which is not shown because it would clutter the drawing immensely that goes to just about everything in FIG. 2.

The Error Catch RAM 32 is addressed by the same address that is applied to the Aux RAM 31, and it either stores or retrieves information about errors, which operations are performed in conjunction with a Post Decode Circuit, to be discussed later. As with the paths 33 and 34 from the Aux RAM 31, paths 61 (into the Error Catch RAM) and 62 (from the Error Catch RAM) are preferably MUX'ed outputs from a multi-bank memory (the Error Catch RAM 32), in accordance with configuration information distributed by the Ring Bus (not shown).

Note that the Data MUX 35 has as inputs the STORED DATA output 33 from the Aux RAM 31 as well as data 28 from the registers DH and DL in the collection of ALU's 24. The Data MUX 35 selects which of these inputs (28, 33) to present as its output 38, which is then applied as one of two vector components to a Transmit Vector Mapper/Serializer & Receive Vector Compare Data Circuit 40 (the other component is the output 39 of the Addr. Bit Select circuit 37). Data MUX 35 performs this selection in accordance with values 36 stored in PGM SPAM 20.

Circuit 40 can perform three functions: assemble vector components (38, 39) into an ordered logical representation of an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT 14 on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19. The output of Circuit 40 is an up to sixty-four bit vector 44 that is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT 14 via the associated instance of Pin Electronics 9. That is, each instance of Pin Electronics 9 receives Transmitted & Received Vectors 7 and Pin Electronics configuration information 8 from its associated Timing/Formatting & Comparison circuit 52.

The Timing/Formatting & Comparison circuit 52 has an Internal SRAM 54 addressed by the same Instruction Address ("A" in the small circle) as is the Program SRAM of the Micro-Controller Sequencer 19. (An External DRAM 53 may be used in place of the Internal SRAM 54.) The Internal SRAM 54 (or external DRAM 53) assists in the production of Drive and Comparison cycles. Drive cycles apply a transmit vector to the DUT. Comparison cycles receive a vector presented by the DUT and examine it to determine if it matches previously supplied comparison data. Both Drive and Comparison cycles are adjustable as to their duration, whether and when a load is applied, and when data is latched or strobed. The comparison produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60. At present, it is sufficient to say that the Post Decode circuit 60 can inspect via programmatic criteria both incoming error information 59 and (previously) stored error information 62A–D (stored in Error Catch RAM) to produce condensed and more readily interpretable error information which may then by stored back into the Error Catch RAM 32 via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nanoseconds ("nsec"), and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

With specific reference to FIGS. 1 & 2 of the drawings, there is shown a DUT tester 6, which is an application specific integrated circuit (ASIC) comprising a primary memory 20 embedded within a sequencer 19. The primary memory 20 comprises a 4 k vector SRAM having a 208-bit vector length. Each vector represents a single instruction to the sequencer 19 and surrounding circuitry. Accordingly, the terms test vector and instruction are used interchangeably herein. The primary memory 20 stores a plurality of program vectors, or instructions, that are executed by the sequencer 19 to perform a test pattern. A plurality of arithmetic logic units (ALUs) 24 operates in conjunction with the sequencer 19 to perform program operations as directed by the program vectors in the test pattern. The program vectors as executed by the sequencer 19 generate electrical control signals that are fed into a timing control and analog pin electronics 9 to exercise the device under test (DUT) 14. A secondary memory 21 is external to the ASIC and is a 256 Mbit DRAM. The secondary memory 21 is connected to a memory controller 410 and a first in first out (FIFO) tertiary memory 412 (shown in FIG. 4 of the drawings). As one of ordinary skill in the art appreciates, the DRAM memory 21 is less costly per bit of memory capacity, but has a read latency associated with it. The SRAM memory is more costly than the DRAM, but has a significantly smaller read latency.

What is of consequence in the present invention is that the read latency of the SRAM does not affect the speed with which vectors can be executed by the sequencer 19 and applied to the DUT 14. The read latency of the DRAM, however, is large enough to adversely affect the precision with which vectors may be applied to the DUT 14. In order to accommodate a test pattern longer than the 4 k SRAM length, a method according to the teachings of the present invention utilizes DRAM for storage of one or more test patterns while making provision to eliminate any adverse impact the read latency of the DRAM may have on the timing of the test pattern during its execution. In a specific embodiment, a design decision limits the width of the secondary memory 21, DRAM, to 32 bits. Accordingly, there is a simplified instruction set available for those test patterns that are to make use of the storage in the secondary memory 21.

Figure 3:
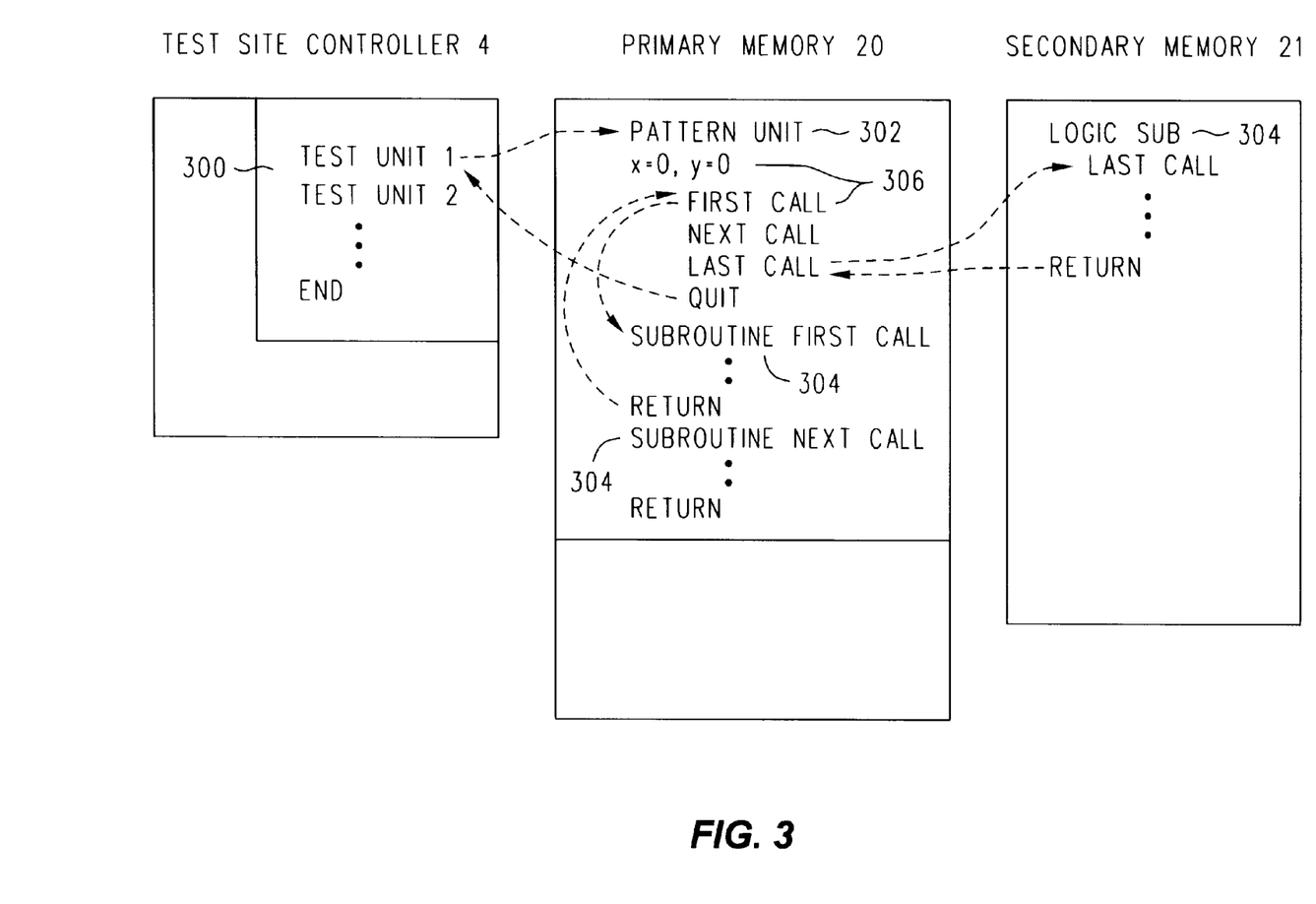
FIG. 3 is a representation of a software unit organization in accordance with the present invention.

With specific reference to FIG. 3 of the drawings and for the purpose of establishing consistent nomenclature, there is shown an abstraction of the software units that run on the test site controller 4 and the DUT tester 6. A test program 300 in a specific embodiment is a collection of "C" instructions that run on the test site controller 4. Typically, a single test program fully tests one type of memory. Each test program calls one or more test patterns 302 that are downloaded into the primary memory 20. A test pattern to 302 typically comprises a series of program instructions or test vectors 306. Also downloaded into the primary and secondary memories 20, 21 are one or more subroutines 304 that are called by certain ones of the test vectors 306. Multiple test vectors 306 generate the sequence and groupings of "1"'s and "0"'s that are written to and read from the DUT 14 that verify proper operation of a function for the DUT 14. There are two different types of subroutines according to an aspect of the present invention; algorithmic and logic. Logic subroutines are characterized by a simplified instruction set including direct specification of vectors comprising "1's" and "0's" that are applied to the DUT 14, repeating an instruction a specified number of times, and returns from the logic subroutines. Algorithmic subroutines are characterized by a superset of the instructions available in e logic subroutine, and additionally include instructions that call other subroutines, generate patterns through the use of arithmetic operations, unconditional and conditional branching, and calls that transfer sequencer instruction fetch operations to a different memory source. Due to the additional flexibility of the algorithmic subroutines, the algorithmic subroutines have -he capability of generating very large test patterns using a small amount of memory. This fact permits efficient use of the embedded SRAM 20. Conversely, the logic subroutines tend to require more storage space. The significance of the distinction will become apparent to one of ordinary skill in the art through a full reading of the present detailed description.

Figure 4:
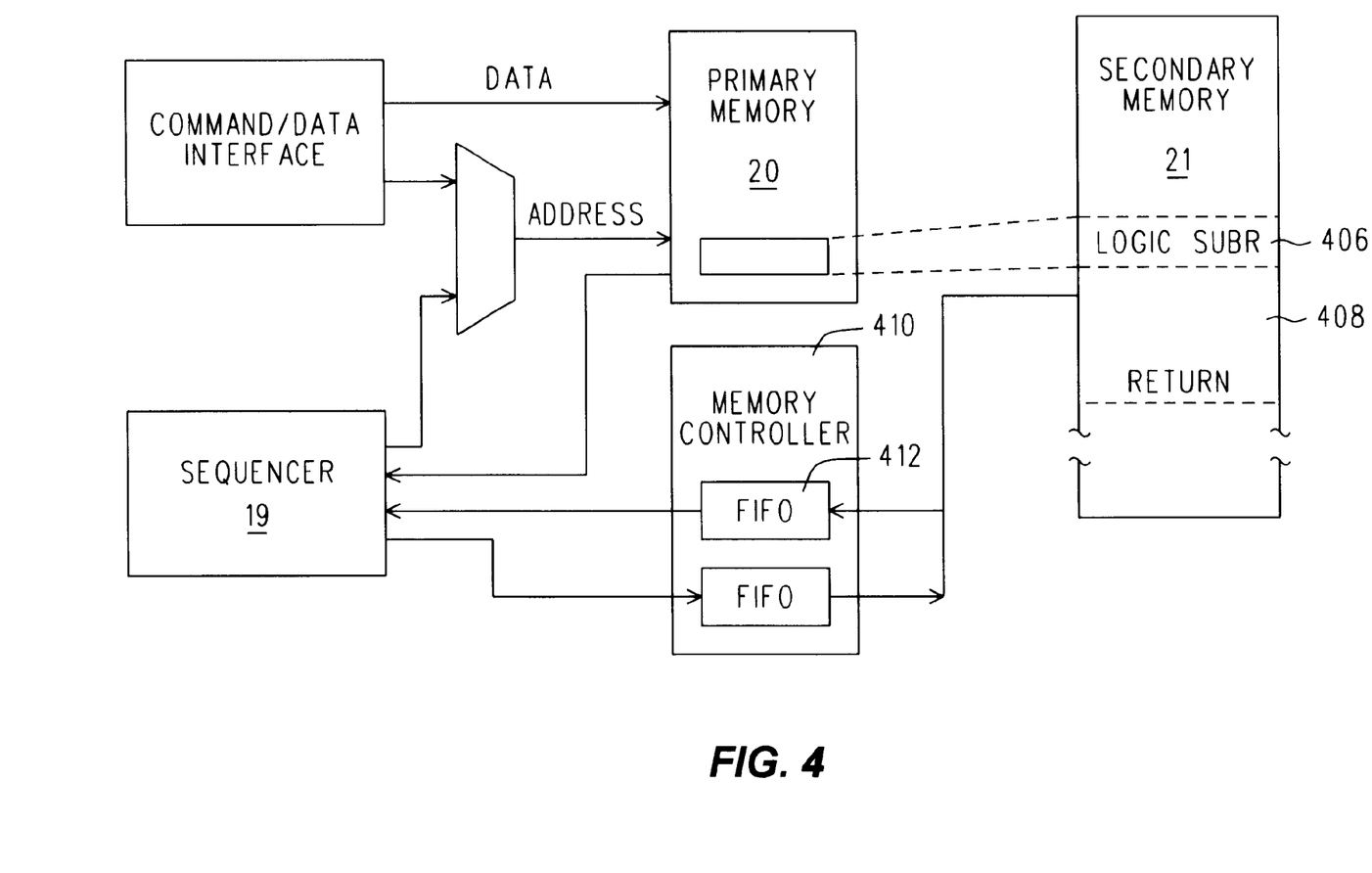
FIG. 4 is a representation of a sequencer and its interface to primary and secondary memories according to the teachings of the present invention.

During execution of each test pattern 302, and with specific reference to FIGS. 3 and 4 of the drawings, the sequencer 19 increments through the address space of the primary memory 20 thereby fetching an addressed instruction word for execution. The sequencer 19 continues to sequentially increment through the primary address space until a current instruction indicates that the sequencer 19 should branch to another location for the next instruction fetch. In one case, the branch is to another location in the primary memory 20. In other cases, it is desirable to take advantage of the additional storage space afforded by a larger secondary memory 21. Accordingly, it is a feature of a test according to the teachings of the present invention to be able to execute a subroutine 304 that is stored in the secondary memory 21 but is called by an instruction 306 in the primary memory 20. An example of when external storage of a subroutine 304 is desirable is when a user wishes to execute a logic subroutine that is too large to fit into the space-limited primary memory 20. If the sequencer 19 were to initiate reception and execution of instructions 306 directly from the secondary memory 21, the read latency associated with the first instruction fetch from the secondary memory 21 would adversely affect the proper and consistent timing of test vectors as applied to the DUT 14. Accordingly, there is a need for a technique to eliminate the adverse affects of the secondary memory read latency. In a general embodiment, it is also possible to call algorithmic subroutines that are stored in the secondary memory. In a specific embodiment, however, design decisions for the present embodiment establish that the secondary memory 21 be 32 bits wide, which is not as wide as the primary memory 20. In this specific embodiment, therefore, the sequencer 19 must use more than one cycle to fetch an algorithmic instruction from the secondary memory 21. This adversely affects the timing of the test pattern. As one of ordinary skill in the art will appreciate, expanding the width of the secondary memory 21 and associated busses that support it will obviate this issue.

To take advantage of the additional storage afforded by the secondary memory 21 while also avoiding the impact that the DRAM read latency might have on the test pattern timing, a logic subroutine that is to be located in the secondary memory 21 and called by an instruction in the primary memory 20 is divided into a first portion 406 and a second portion 408. A copy of the first portion 406 of the logic subroutine is present in the primary memory 20. The second portion 408 of the logic subroutine that is logically contiguous with the first portion 406 is present only in the secondary memory 21 prior to initiation of the test pattern. At the point in the test pattern when it is desirable to run the logic subroutine that is located in the secondary memory 21, a secondary memory access instruction (not shown in FIG. 4) in the primary memory 20 directs a memory controller 410 to begin loading the instructions that comprise the second portion 408 of the subroutine into a tertiary memory 412. The secondary memory access instruction includes an address location of the first instruction that is to be loaded into the tertiary memory 412, which is the first instruction of the second portion 408. Immediately thereafter and while the memory controller 410 is copying the second portion 408 into the tertiary memory 412, the first portion 406 of the program routine is executed by the sequencer 19. The tertiary memory 412 is an inbound FIFO memory that receives and holds the instructions that have been loaded from the secondary memory 21 into the tertiary memory 412 by the memory controller 410. Upon completed execution of the first portion 406, the sequencer 19 executes an instruction that transfers the sequencer instruction fetches to the tertiary memory 412. The sequencer 19 accepts the first instruction in the second portion 408 from the tertiary memory 412 on a clock cycle immediately after the execution of the last instruction in the first portion 406 in the primary memory 20. Note that the tertiary memory 412 is also an embedded SRAM memory that does not exhibit significant read latency. The sequencer 19 continues to receive instructions from the tertiary memory 412 to execute the entire second portion 408. As the sequencer 19 takes instructions from the tertiary memory 412, the memory controller 410 continues to monitor the available space in the tertiary memory 412 and either fetches additional instructions from the secondary memory 21 or holds off fetches as needed. In a specific embodiment, the memory controller 410 operates at a 125 Megahertz ("MHz") clock cycle while the sequencer 19 operates at a 100 MHz clock cycle. The differential in clock cycle rates ensures that the memory controller 410 is able to stay sufficiently ahead of the sequencer 19 so as never to be in a position to cause the sequencer 19 to wait for the next instruction. This provides adequate margin to maintain all timing for the signals to the DUT 14.

The process of fetching and moving the instructions from the secondary memory 21 has associated with it the inherent read latency of the DRAM. The quantity of instructions selected to be the first portion 406, therefore, should have an execution time equal to or greater than the worst case sum of the read latency of the DRAM, and the refresh cycles of the DRAM. In a specific embodiment, the first portion contains fifty-two (52) instructions, but this number is likely to change with future revisions of the DUT tester and memory upgrades. As one of ordinary skill in the art can appreciate, the closer the execution time of the first portion 406 is to the actual latency of the secondary memory 21 access, the more efficient the use of the secondary memory 21. The second portion 408, therefore, is accessible to the sequencer 19 without latency because the tertiary memory 412 is populated and ready before the sequencer 19 needs instructions for execution. As the tertiary memory 412 FIFO is emptied, contiguous instructions located in the secondary memory 21 continue to be accessed by the memory controller 410 and loaded into the tertiary memory 412.

The last instruction in the subroutine is a "return" instruction. Upon completion of the subroutine stored in the secondary memory 21, therefore, the sequencer 19 executes the "return" instruction. The "return" instruction instructs the sequencer 19 to begin accepting instructions from the primary memory 20. The test pattern 302 execution continues with instructions fetched from the primary memory 20 unless and until the sequencer 19 encounters another one of the secondary memory access instructions.

Figure 5:
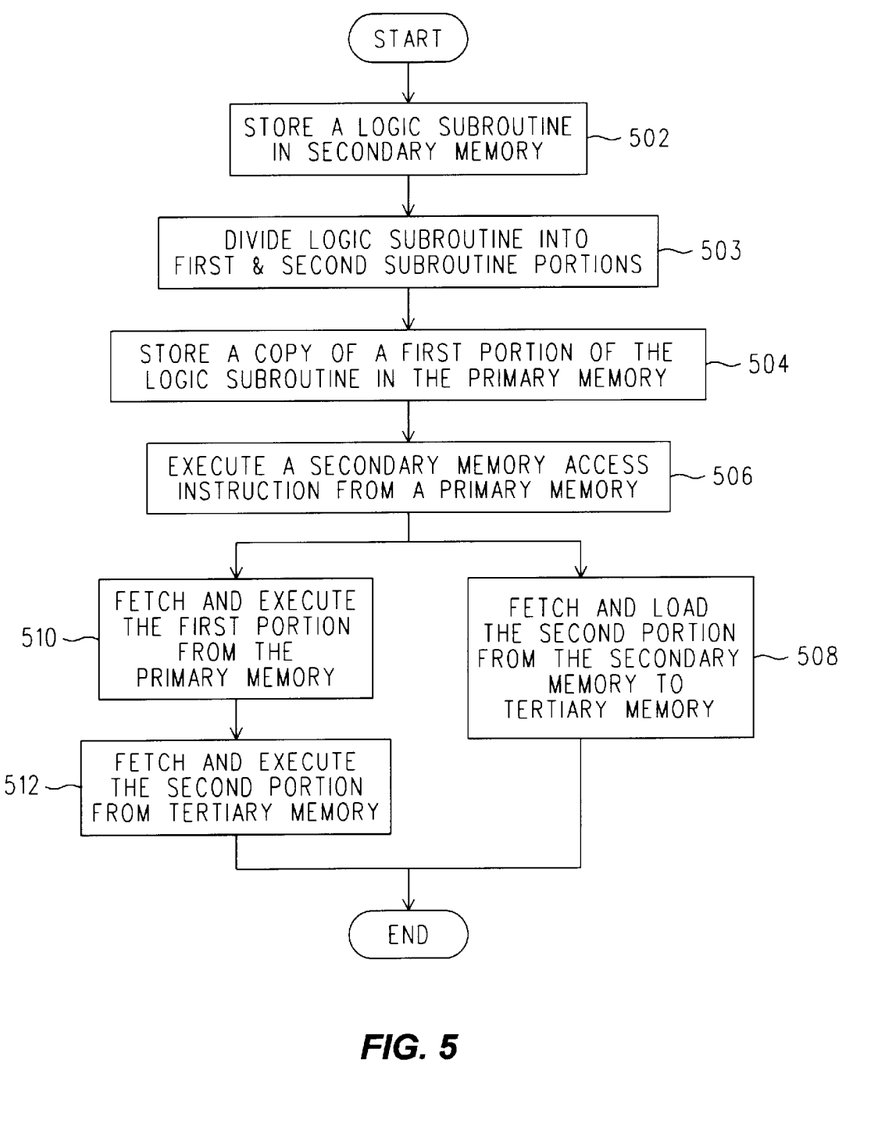
FIG. 5 is a flow chart according to the teachings of the present invention.

With specific reference to FIG. 5 of the drawings, there is shown a flow chart of an embodiment of a method according to the teachings of the present invention that permits execution of a logic subroutine that is stored in the secondary memory 21 without suffering the adverse effects of read latency. In the method illustrated, the program routine is stored in the secondary memory 21 and is logically divided into the first portion 406 and the second portion 408 and is shown as steps 502 and 503. A copy of the first portion 406 is stored in the primary memory 20 and is shown as step 504. As part of test program execution, a secondary memory access instruction that is stored in the primary memory 20 is executed by the sequencer 19 prior to execution of the copy of the first portion 406 located in the primary memory 20 as shown in step 506. The secondary memory access instruction is an instruction to the memory controller 410 to begin reading (fetching) and loading the second portion from the secondary memory into the tertiary memory 412 and is shown in step 508. The process of reading from the secondary memory 21 begins at a secondary memory address location that is specified by the secondary memory access instruction. Once started, the memory controller 410 operates independently of the sequencer 19. The sequencer 19, therefore, is available to fetch and execute the instructions that comprise the first portion 406 from the primary memory 20, as shown in step 510, independent of the fetch and load from the secondary memory 21 into the tertiary memory 412. The last instruction of the first portion 406 is one that directs the sequencer 19 to fetch instructions from the tertiary memory 412 shown as step 512. This continues until the sequencer 19 encounters a "return" instruction. Upon execution of the"return" instruction, the sequencer 19 fetches the next instruction from the address location in the primary memory 20 just after the last instruction in the first portion 406.

Figure 6:
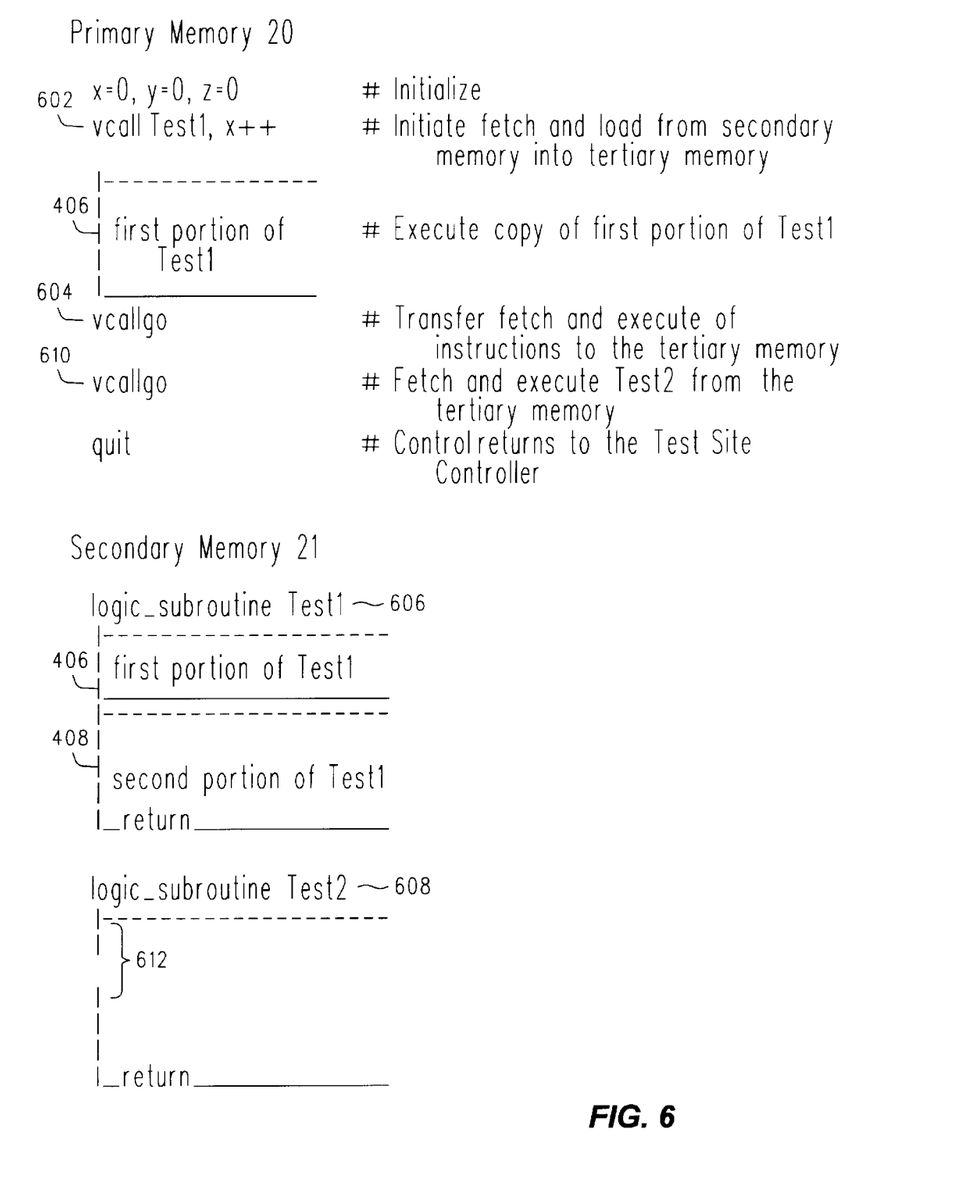
FIG. 6 is a representation for illustrative purposes of a test pattern including a call to a subroutine located In secondary memory.

With specific reference to FIG. 6 of the drawings including reference to FIG. 4 for support, there is shown sample code to illustrate the process of executing a logic subroutine, TEST1 in the example, stored in the secondary memory 21. The first portion 406 is copied into the primary memory 20 and the second portion 408 is stored in the secondary memory 21. This storage into the primary and secondary memories 20, 21 is done prior to execution of the program. In the sample, the code in the primary memory 20 initializes the variables x, y, and z to "0". The secondary memory access instruction 602, "vcall" in the illustration, instructs the sequencer 19 to initiate copying of the second portion 408 from an address location beginning at the start of the second portion 408 of the "TEST1" subroutine 606 in the secondary memory 21 to the tertiary memory 412. As the memory controller 410 performs the copy and store, the sequencer 19 continues to execute instructions from the primary memory 20 which comprise the first portion 406 of the TEST1 subroutine 606. At the end of the first portion 406, the sequencer 19 executes a memory access transfer instruction 604, "vcallgo" in the illustration that transfers the location of the sequencer 19 instruction fetches from the primary memory 20 to the tertiary memory 412. A "return" instruction is located at the end of the TEST1 subroutine and is executed by the sequencer 19 after being fetched from the tertiary memory 412. The "return" instruction operates to transfer the location of the sequencer's 19 instruction fetches from the tertiary memory 412 back to the primary memory 20. The return instruction operates to pop the last address off of a stack causing the sequencer 19 to fetch its next instruction at the address location directly after the most recent "vcallgo" instruction, shown at reference numeral 604 in the example.

An additional efficiency that can be realized is to organize a plurality of logic subroutines in the secondary memory 21 in the order in which they are called by instructions in the test pattern that is loaded into the primary memory 402. After completion of the first subroutine "TEST1" 606 in the example, a second subroutine "TEST2" 608 in the example, may be executed immediately with another "vcallgo" instruction 610. The second subroutine call does not require that a copy of the first portion 406 of the second subroutine be placed into the primary memory 402 because the memory controller has already loaded the tertiary memory 412 with instructions from the second subroutine 608. This efficiency is due to the fact that the memory controller 410 fills the tertiary memory 412 as the sequencer 19 is fetching instructions and emptying out the tertiary memory 412 regardless of logical delineations and subroutine boundaries. During the fetch and execute of the last few instructions of the second portion 408 of to the first subroutine 606, the beginning of the second subroutine 612 which is contiguous with the first subroutine 606 in the secondary memory address space 21, is loaded into the tertiary memory 412. Recall that the beginning of the second subroutine 612 is what would have been the first portion of the second subroutine 608 that is loaded into the primary memory 20 as described earlier. As a result of this operation, the first portion of the second subroutine 608 is already in tertiary memory and is ready to be fetched and executed by the sequencer 19 without latency. As one or ordinary skill in the art will appreciate, a single secondary memory access instruction followed by multiple vcallgo instructions are useful for any number of logic subroutines that are contiguous in the secondary memory address space 21. In order to organize the test pattern 302 according to the teachings of the present invention that takes advantage of the efficiencies available through use of the secondary memory 21, a test developer need not perform the administration of the instructions regarding their placement in the primary and secondary memories 20, 21. A compiler performs this and other administrative tasks and is run "offline", i.e. at a time different from test time, either on an external computer or on the test system controller 2. For purposes of clarity, the present discussion is limited to those tasks performed by the compiler to support administration of the call to a logic subroutine stored in the secondary memory 21.

The compiler processes user developed test program source code to perform the process described above. The test program source code is typically located in a file stored in the disk at the test system controller 2 and comprises instructions written in a somewhat readable test pattern language. The language format is not of particular importance, as long as the compiler processing the code has a priori knowledge of the syntaxes used by the language. The compiler reads and operates on the contents of the user developed test program source code and generates object code, which is written in a machine language, that is stored in another file. The object code file is later downloaded into the appropriate locations in the tester.

In the user developed test program source code, the user has specifically located a subroutine into the secondary memory 21 and has included a call instruction located in the primary memory 20 to the subroutine in the secondary memory 21. The language format of the instruction that calls the subroutine located in the secondary memory 21 is "vcall <label of the subroutine>" in the described embodiment. The compiler performs two passes. In the first pass, the compiler sequences through all of the instructions in the source code file, one by one, and evaluates each instruction. As it sequences through the instructions, it keeps track of the current sequential address location, builds a branch destination table, a vcall table, and stores all of the first portions 406 that are to be used in the program for later use. The following operations are performed as the compiler sequences through each instruction.

During the first pass, the compiler builds the branch destination table by identifying and storing all labels that are encountered and indexes each label with its address location. During the first pass, the compiler also builds the vcall table by identifying the address location of the vcall instruction and the label of the subroutine specified in the vcall. During the first pass, if the compiler encounters a logical subroutine declaration that is located in secondary memory 21, the compiler begins to store instructions that eventually comprise the first portion 406, into a temporary compiler memory space. As each instruction is evaluated, the compiler counts the number of instructions being stored in the temporary memory space. The compiler continues to store each instruction up to a predetermined number, such as 51, before completing temporary storage of the first portion 406. For the last instruction in the predetermined number of instructions, the compiler includes in the copied vector the secondary memory access transfer instruction command, "vcallgo" in the example, to complete the full predetermined number of instructions for the copy of the first portion 406. In a specific embodiment, the secondary memory access transfer instruction does not include a parameter because it is merely transferring the site of the instruction access by the sequencer 19 to the tertiary memory 412. If the compiler encounters a "return" statement before reaching the upper limit of the number of instructions to store, it stops storing the first portion 406, shortens that stored array, and does not append the vcallgo instruction. In this special case, the subroutine to which the vcall instruction refers, is shorter than the space allotted to the first portion 406. That being the case, all of the instructions in the subroutine may be copied to the first portion 406 without the system availing itself of the process that fetches instructions from the tertiary memory 412. In this case, the vcall instruction is deleted in primary memory 20 and the secondary memory access transfer instruction word is not included in the code. If the vcall instruction were permitted to remain in the code, however, it would not adversely affect execution of the test pattern, and would operate to load the tertiary memory with unused instructions. The predetermined number of instructions that are stored in the first portion 406 may be any number but in the embodiment described, the predetermined number is chosen so that execution of the entire first portion 406 by the sequencer 19 is equal to or greater than the sum of the read latency and the refresh cycle of the secondary memory 21. Because the memory controller 410 operates at a speed faster than the sequencer 19, the predetermined number should be sufficiently large to accommodate the read latency of the secondary memory 21 and permit the memory controller 410 to load the tertiary memory 412 to the point that the memory controller 410 can provide instructions to the tertiary memory 412 without requiring the sequencer 19 to wait for a next instruction.

Upon completion of the first pass and before initiation of the compiler's second pass, the compiler reads through the vcall table one entry at a time beginning at the first vcall encounter. For each entry in the vcall table, the compiler reads the address location of the vcall instruction and then evaluates each entry in the branch destination table. For each entry in the branch destination table having an address that is greater than the vcall address location, the address is adjusted to accommodate the additional instructions that comprise the first portion 406 in the vcall command. If an address in the branch destination table is greater than that in the vcall table, the address in the branch destination table is adjusted by adding to it, the predetermined number of instructions that are contained in the first portion 406, for example fifty-two (52) as in the present embodiment, or the total number of instructions in the subroutine in the special case when the subroutine referred to is copied in its entirety to the primary memory 20.

During the second pass, the compiler generates the object code and stores it in a file. The compiler increments through the instructions in the source file and converts each instruction to the appropriate binary word that comprises the machine code. As the compiler evaluates each instruction and using the branch destination and vcall tables, when it encounters a branching command, the compiler refers to the branch destination table and locates the corresponding label. It then reads the associated address location entry to which the branching command is referring. It then stores the address into the appropriate field of the machine code instruction. The compiler also adjusts the calls in the vcall command to point to an address location in the secondary memory 21 that points to the beginning of the second portion 408.

In a first compiler embodiment, when the compiler encounters a vcall command 602, it reads, converts to machine code, and copies the appropriate first portion 406 from the temporary compiler memory space to the next predetermined number of address locations, in the object code destined for storage in the primary memory 20. As the reader will recall, the "vcallgo" command is not appended to the end of the first portion 406 for appropriate transfer of sequencer instruction fetches if the logic subroutine that is being copied has fewer instructions than the length allotted for storage of the first portion 406 in the primary memory 20. To take care of this case, the compiler maintains entries in a table that includes a vector count for each first portion 406 that is copied. If the compiler reaches a subroutine return or quit instruction before the vector count reaches the predetermined number of vectors that are to make up the first portion 406 the vector count entry is kept for address offset purposes executed in the compiler's second pass of processing as previously discussed, and the vcallgo command is not included in the copied instruction.

In a second compiler embodiment, the compiler does not perform the conversion and copying of the first portion 406, but only reserves space for the first portions 406 to be later inserted after the vcall command. In this embodiment, the values indicating the number of vectors in each first portion 406 are stored as part of the object code. Memory management software running on the test site controller 4 performs the copies if and when they are needed during test program execution. The address offset administration is performed by the memory management software in between test pattern execution and does not adversely affect timing during execution of the pattern. In a third compiler embodiment, the compiler generates object code that contains "unresolved calls", i.e. calls to address locations that are not yet known. In this embodiment, the address calls are stored in the object code as unique symbols. Just prior to test pattern execution, the memory management software resolves the unresolved symbols and adjusts for address offsets as each pattern is loaded into the primary memory.

Although preferred embodiments of the invention are described, they are illustrative only. Other embodiments and modifications of the invention are possible and are covered by the spirit and scope of the appended claims.

What is claimed is:

1. A method for executing an integrated circuit (IC) test program, said IC test program comprising main program instructions including at least one subroutine calling instruction and at least one called subroutine, the method comprising the steps of:

partitioning said at least one called subroutine into first and second subroutine portions, loading said main program instructions into a primary memory, said main program instructions including said at least one said calling instruction, loading said first portion at a location in said primary memory contiguous with said calling instruction, inserting a memory transfer access instruction after said first portion, loading a remainder of said main program instructions into said primary memory, fetching and executing instructions from said primary memory, executing said calling instruction from said primary memory, said calling instruction causing said second portion of said called subroutine to be loaded into a tertiary memory FIFO element from a secondary memory, executing said first portion from said primary memory, executing said memory transfer access instruction to initiate the steps of fetching and executing said second portion of said called subroutine from said tertiary memory FIFO element, executing a return instruction in said second portion of said called subroutine, and resuming fetching and executing said main program instructions from said primary memory.

2. A method for executing a program as recited in claim 1 wherein said calling instruction comprises a secondary memory access instruction.

3. A method for executing a program as recited in claim 1, wherein said steps of loading said called subroutine from said secondary memory into said tertiary memory occurs simultaneously with said step of fetching and executing said first portion in said primary memory.

4. A method for executing a program as recited in claim 3 wherein a first portion of said called subroutine is disposed in said primary memory as program instructions immediately after said calling instruction, said step of fetching and executing said first portion having a program execution time, said program execution time taking at least as long as an execution tame for said step of loading said called subroutine into said tertiary memory.

5. A method for executing a program as recited in claim 1, wherein there is a plurality of said called subroutines and further comprising repeating the steps of partitioning, loading and inserting for each one of said called subroutines prior to said steps of fetching and executing and repeating said steps of executing said first portion from said primary memory and executing said memory transfer access instruction to initiate the steps of fetching land executing said second portion of said called subroutine from said tertiary memory for each one of said called subroutines in said main program.

6. A method for executing a program as recited in claim 5, said step of continuing said step of fetching and executing instructions from said tertiary memory, which is initiated by a continued memory access instruction.

7. An apparatus for executing an integrated circuit (IC) test program routine comprising:

a primary memory having main program instructions and at least one first portion of a called subroutine stored therein, a secondary memory having program instructions of subroutines called in said main program instructions stored memory access instruction.

a tertiary memory comprising a first-in-first-out (FIFO) element connected to said secondary memory, a memory controller capable of directing access and storage of said logic program instructions located in said secondary memory from said secondary memory to said tertiary memory upon execution of a secondary memory access instruction in said program instructions located in said primary memory, and a sequencer connected to said primary and tertiary memories, wherein said sequencer accesses and executes said program instructions stored in said primary and tertiary memories as directed by said program instructions.

8. An apparatus as recited in claim 7 wherein said primary memory is Static Random Access Memor (SRAM).

9. An apparatus as recited in claim 7 wherein said secondary memory is Dynamic Random Access Memory (DRAM).

10. An apparatus as recited in claim 7 wherein a memory controller operates at a faster speed than said sequencer.

11. An apparatus as recited in claim 7 wherein said secondary memory has a read latency and a refresh cycle time associated therewith and said FIFO has a depth sufficient to store enough program instructions where a program execution time of program instructions stored in said FIFO by said sequencer is equal to or greater than a sum of said read latency and said refresh cycle time of said secondary memory.

12. An apparatus as recited in claim 7 wherein a single application specific integrated circuit comprises said sequencer, said primary memory, said tertiary memory, and said memory controller.

13. An apparatus as recited in claim 12 wherein said secondary memory is separate from said single application specific integrated circuit.

14. A method for compiling an integrated circuit (IC) test program source code into object code, the source code comprising a test pattern having a calling instruction, said source code also having a called subroutine, the method comprising the steps of:

partitioning said called subroutine into a first portion and a second portion, converting said first portion into first portion object code and said second portion into second portion object code, evaluating said test pattern including said calling instruction, converting each line of source code of said test pattern into corresponding object code, inserting a copy of said first portion object code portion of said called subroutine into said object code test pattern contiguous with said calling instruction, inserting a secondary memory access instruction into said test pattern after and contiguous with said first portion object code in said test patter, converting each remaining line of source code of said test pattern into corresponding object code, storing the resulting test pattern object code into a test pattern file for downloading into a primary memory, and storing said second portion object code into a subroutine file for downloading into secondary memory.

15. A method for compiling a program source code as recited in claim 14 said step of inserting further comprising evaluating a total length of said called subroutine and inserting said copy of said portion of said called subroutine in place of said calling instruction only if said total length of said called subroutine is less than a predetermined number of instructions.

* * * * *